(12) United States Patent
Yamaguchi et al.

(10) Patent No.: US 7,307,289 B2
(45) Date of Patent: Dec. 11, 2007

(54) PRESSED-CONTACT TYPE SEMICONDUCTOR DEVICE

(75) Inventors: Yoshihiro Yamaguchi, Fukuoka (JP); Kenji Oota, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 18 days.

(21) Appl. No.: 11/212,562

(22) Filed: Aug. 29, 2005

(65) Prior Publication Data

US 2006/0038253 A1    Feb. 23, 2006

Related U.S. Application Data

(62) Division of application No. 10/648,232, filed on Aug. 27, 2003, now Pat. No. 6,943,382.

(30) Foreign Application Priority Data

Mar. 19, 2003    (JP) ............... P 2003-075548

(51) Int. Cl.
*H01L 29/74*    (2006.01)
(52) U.S. Cl. ............... 257/131; 257/E29.212
(58) Field of Classification Search ............... 257/131, 257/E29.212
See application file for complete search history.

(56) References Cited

U.S. PATENT DOCUMENTS

| 4,377,816 | A | 3/1983 | Sitting |
| 4,450,469 | A | 5/1984 | Yamamoto |
| 4,752,818 | A | 6/1988 | Kushida et al. |
| 4,951,110 | A | * | 8/1990 | Miller et al. ............... 257/131 |
| 5,210,601 | A | 5/1993 | Kitagawa et al. |

(Continued)

FOREIGN PATENT DOCUMENTS

EP    0 043 099 A2    1/1982

(Continued)

OTHER PUBLICATIONS

Vitězslav Benda, et al., "Power Semiconductor Devices Theory and Applications", John Wiley & Sons, 1999, pp. 77 to 79.

(Continued)

*Primary Examiner*—Jerome Jackson
(74) *Attorney, Agent, or Firm*—Oblon, Spivak, McClelland, Maier & Neustadt, P.C.

(57) ABSTRACT

A $P^{++}$-type first diffusion layer is formed by diffusing P-type impurities on a front side of an $N^-$-type semiconductor substrate, and an N-type fourth diffusion layer which is shallower than the first diffusion layer is formed by diffusing N-type impurities on the front side, and a P-type second diffusion layer is locally formed in a ring-shape so as to be exposed on the lateral side by diffusing P-type impurities on the back side, and P-type impurities are diffused on the back side of the substrate and a $P^+$-type third diffusion layer is locally formed so as to be distributed inward from the second diffusion layer and not to be exposed to the lateral side, and the P-type second diffusion layer and the $P^+$-type third diffusion layer are formed in the two-stage structure, thereby various characteristics can be improved.

1 Claim, 6 Drawing Sheets

U.S. PATENT DOCUMENTS 5,710,442 A 1/1998 Watanabe et al.
5,883,403 A 3/1999 Ishikawa et al.
6,163,040 A 12/2000 Akiyama et al.

FOREIGN PATENT DOCUMENTS

| | | |
|---|---|---|
| EP | 0 419 898 A2 | 4/1991 |
| EP | 0 419 898 B1 | 4/1991 |
| JP | 3-120724 | 5/1991 |
| JP | 8-116047 | 5/1996 |
| JP | 8-264754 | 10/1996 |
| JP | 9-260640 | 10/1997 |

OTHER PUBLICATIONS

U.S. Appl. No. 11/212,562, filed Aug. 29, 2005, Yamaguchi et al.
U.S. Appl. No. 11/212,602, filed Aug. 29, 2005, Yamaguchi et al.

* cited by examiner

FIG. 8 REVERSE RECOVERY CHARACTERISTICS
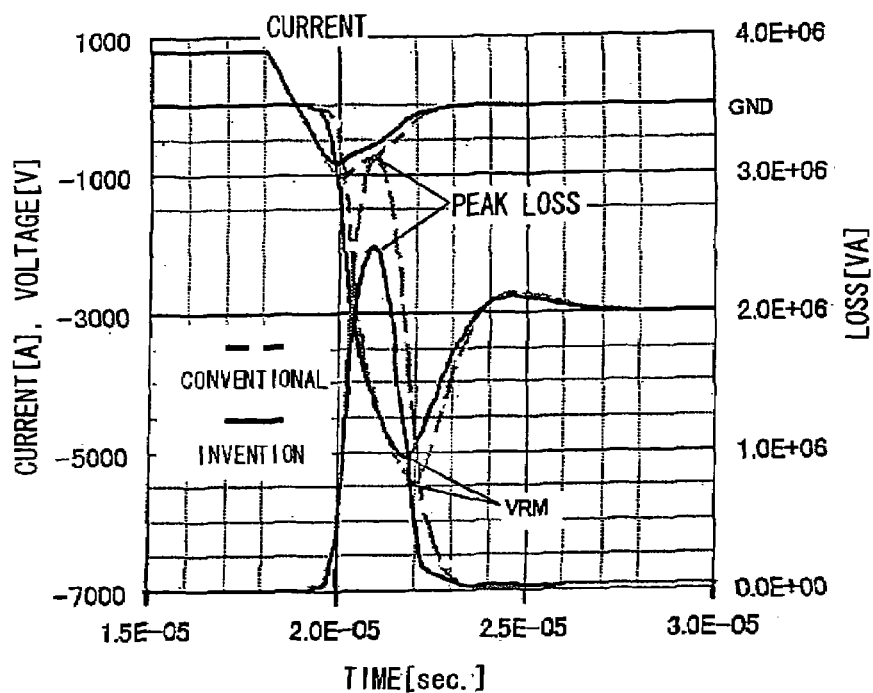
FIG. 9 REVERSE-BLOCKING VOLTAGE CHARACTERISTICS
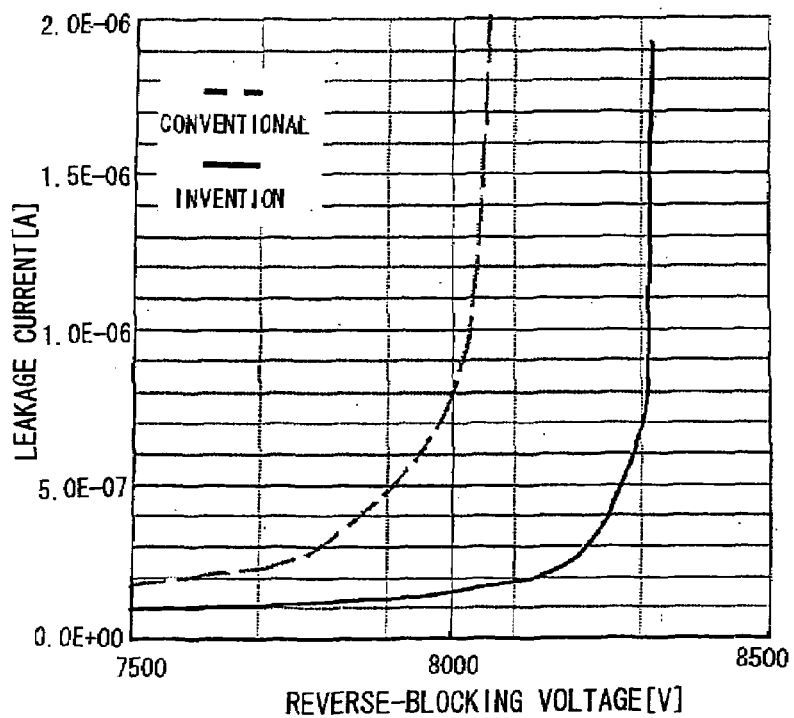

PRESSED-CONTACT TYPE SEMICONDUCTOR DEVICE

CROSS REFERENCE TO RELATED APPLICATIONS

This application is a divisional and claims priority under 35 U.S.C. §120 to U.S. application Ser. No. 10/648,232, filed Aug. 27, 2003 now U.S. Pat. No. 6,943,382, and is also based upon and claims priority under 35 U.S.C. §119 from Japanese Patent Application No. 2003-075548, filed Mar. 19, 2003, the entire contents of each of which are incorporated herein by reference.

BACKGROUND OF THE INVENTION

1. Field of the Invention

The present invention relates to a pressed-contact type semiconductor device, such as a thyristor, GTO (Gate Turn-off) thyristor, GCT (Gate Commutated Turn-off) thyristor or the like, which has reverse-blocking capability required for applying a circuit in an industry or power control system.

2. Description of the Related Art

In the conventional pressed-contact type semiconductor device, a $P^{++}$-type semiconductor layer is formed by diffusing P-type impurities on a front side of an $N^-$-type semiconductor substrate, a P-type semiconductor layer is formed by diffusing P-type impurities on the back side of the semiconductor substrate, and an N-type semiconductor layer having a depth shallower than that of the $P^{++}$-type semiconductor layer is formed by diffusing N-type impurities on the front side of the semiconductor substrate. Thus, there is provided a PNPN-junction structure as the whole, allowing thyristor operation.

The related prior arts are listed as follows: Japanese Patent Unexamined Publications (koukai) JP-A-8-264754 (1996), JP-A-9-260640 (1997), JP-A-3-120724 (1991) and JP-A-8-116047 (1996).

According to a reverse-blocking type GCT thyristor developed from a thyristor, the higher an operation frequency of the device becomes, the more a ratio occupied by switching loss is increased in the whole generated loss. Therefore, it has been desired to optimize turn-off loss and reverse recovery loss.

SUMMARY OF THE INVENTION

It is an object of the present invention to provide a pressed-contact type semiconductor device in which a reverse-blocking withstand voltage characteristic and a reverse recovery characteristic of a thyristor can be considerably improved.

A pressed-contact type semiconductor device according to the present invention includes: a first conductivity type of semiconductor substrate; a first diffusion layer formed by diffusing a second conductivity type of impurities on a first side of the semiconductor substrate; a fourth diffusion layer formed by diffusing a first conductivity type of impurities on the first side of the semiconductor substrate so as to be shallower than the first diffusion layer; a gate electrode provided on the first side of the semiconductor substrate so as to be in contact with the first diffusion layer; a first electrode provided on the first side of the semiconductor substrate so as to be in contact with the fourth diffusion layer; a second diffusion layer formed by diffusing the second conductivity type impurities on a second side of the semiconductor substrate; and a second electrode provided on the second side of the semiconductor substrate so as to be in contact with the second diffusion layer.

A depth D1 of the first diffusion layer from the first side of the semiconductor substrate and a depth D2 of the second diffusion layer from the second side of the semiconductor substrate may have a relation of D1>D2. The depth D2 of the second diffusion layer and a depth D3 of the third diffusion layer from the second side of the semiconductor substrate may have a relation of D2>D3. The depth D1 of the first diffusion layer, the depth D2 of the second diffusion layer and the depth D3 of the third diffusion layer may have a relation of D1>D2>D3.

Furthermore, a pressed-contact type semiconductor device according to the present invention includes: a first conductivity type of semiconductor substrate; a first diffusion layer formed by diffusing a second conductivity type of impurities on a first side of the semiconductor substrate; a fourth diffusion layer formed by diffusing a first conductivity type of impurities on the first side of the semiconductor substrate so as to be shallower than the first diffusion layer; a gate electrode provided on the first side of the semiconductor substrate so as to be in contact with the first diffusion layer; a first electrode provided on the first side of the semiconductor substrate so as to be in contact with the fourth diffusion layer; a second diffusion layer locally formed by diffusing the second conductivity type of impurities on a second side of the semiconductor substrate so as to be exposed on a lateral side of the substrate; a third diffusion layer locally formed by diffusing the second conductivity type of impurities on the second side of the semiconductor substrate so as not to be exposed on the lateral side of the substrate; and a second electrode provided on the second side of the semiconductor substrate so as to be in contact with the third diffusion layer.

A plurality of lifetime control regions each having a lifetime shorter than that of the semiconductor substrate may be formed inside the semiconductor substrate so as to be substantially parallel to the substrate surface, and a first lifetime control region which is most close to the second and third diffusion layers may have a lifetime shorter than that of a second lifetime control region which is secondly close to the second and third diffusion layers.

A lifetime control region having a lifetime shorter than that of the semiconductor substrate may be formed at a periphery along the lateral side of the substrate, and an internal interface of the lifetime control region may be provided inward from a portion where the internal interface of the second diffusion layer and the internal interface of the third diffusion layer intersect with each other.

BRIEF DESCRIPTION OF THE DRAWINGS

FIGS. 1A and 1B illustrate a first embodiment of the present invention, in which FIG. 1A is a vertical sectional view and FIG. 1B is a plan view.

FIGS. 2A and 2B illustrate a second embodiment of the present invention, in which FIG. 2A is a vertical sectional view and FIG. 2B is a plan view.

FIGS. 5A and 5B illustrate a fifth embodiment of the present invention, in which FIG. 5A is a vertical sectional view and FIG. 5B is a plan view.

FIG. 8 is a graph showing an example of a simulation result of the reverse recovery characteristics.

FIG. 9 is a graphs showing an example of a simulation result of the reverse-blocking voltage characteristic.

DETAILED DESCRIPTION OF THE PREFERRED EMBODIMENTS

This application is based on an application No. 2003-75548 filed Mar. 19, 2003 in Japan, the disclosure of which is incorporated herein by reference.

Hereinafter, preferred embodiments will be described with reference to drawings.

Embodiment 1

Figure 1A:
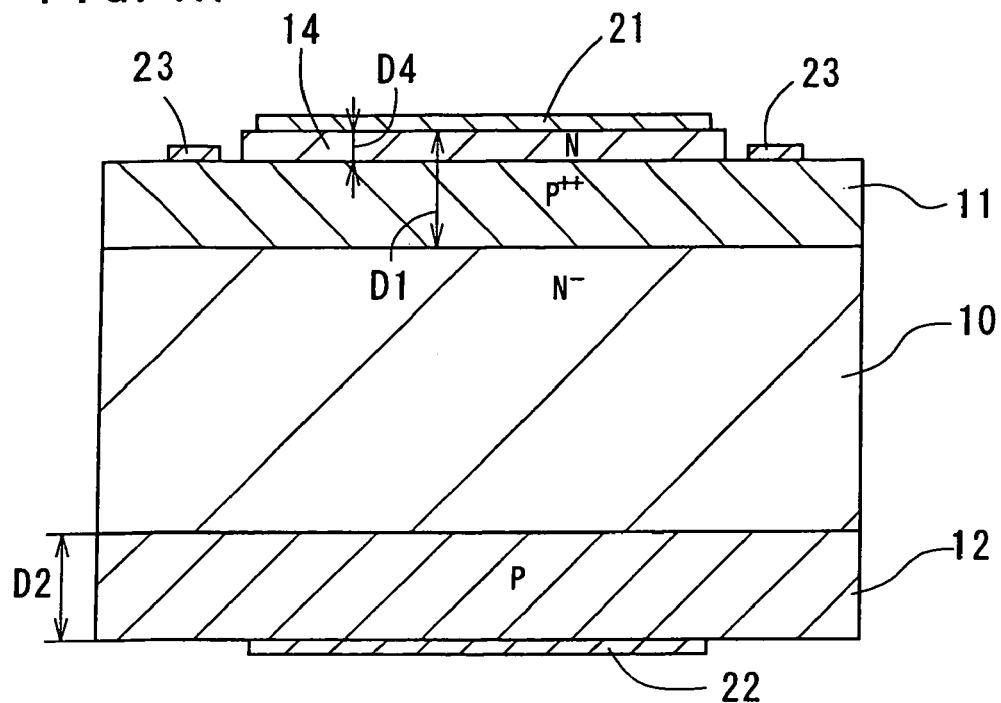
Figure 1B:
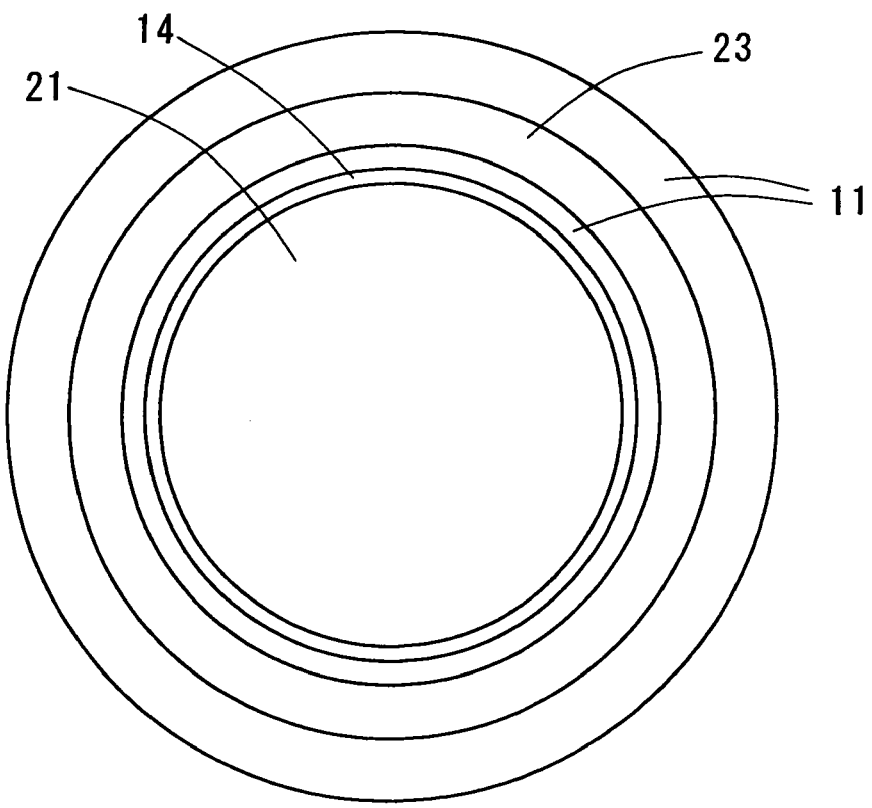

FIGS. 1A and 1B illustrate a first embodiment of the present invention in which FIG. 1A is a vertical sectional view and FIG. 1B is a plan view. A $P^{++}$-type first diffusion layer 11 is formed by diffusing P-type impurities (for example, B, Al or the like) on a front side of an $N^{-}$-type semiconductor substrate 10 (for example, Si or the like). Then, an N-type fourth diffusion layer 14 which is shallower than the first diffusion layer 11 is formed by diffusing N-type impurities (for example, P, As or the like) on the front side of the substrate 10. The fourth diffusion layer 14 is partially removed by etching or the like and the first diffusion layer 11 is partially exposed on the front surface of the substrate.

Meanwhile, a P-type second diffusion layer 12 is formed by diffusing P-type impurities on a back side of the substrate 10.

Thus, there is provided a PNPN-junction structure which is capable of a thyristor operation.

As shown in FIG. 1B, a circular cathode electrode 21 is provided on the front side of the substrate 10 so as to be in contact with the N-type fourth diffusion layer 14 and a ring-shaped gate electrode 23 is provided so as to be in contact with the $P^{++}$-type first diffusion layer 11.

A circular anode electrode 22 is formed on the back side of the substrate 10 so as to be in contact with the P-type second diffusion layer 12.

Then, the operation will be described. As the cathode electrode 21 is connected to a ground line and a positive voltage is applied to the anode electrode 22, the P-type second diffusion layer 12 and the $N^{-}$-type substrate 10 are in a forward bias state, the $P^{++}$-type first diffusion layer 11 and the N-type fourth diffusion layer 14 are in a forward bias state and the $N^{-}$-type substrate 10 and the $P^{++}$-type first diffusion layer 11 are in a reverse bias state, whereby a depletion layer is formed. At this time, a current flows little or nothing because of the depletion layer.

When an anode voltage is further increased and exceeds the breakdown voltage, the current is rapidly increased and a semiconductor device comes into a turn-on state. At this time, the breakdown voltage can be controlled by controlling an amount of the current (carriers) injected from the gate electrode 23.

When a reverse voltage is applied to the anode electrode 22 in the turn-on state, the P-type second diffusion layer 12 and the $N^{-}$-type substrate 10 come into a reverse bias state, the $P^{++}$-type first diffusion layer 11 and the N-type fourth diffusion layer 14 come into a reverse bias state, and the $N^{-}$-type substrate 10 and the $P^{++}$-type first diffusion layer 11 come into a forward bias state. At this time, since it takes time for the carriers stored inside to move, a reverse current flows for a certain period of time.

Then, reverse recovery characteristics can be improved by applying a current to the gate electrode 23 in a direction reverse to that in the on-state in order to actively extract residual carriers. If the residual carrier no longer exists, it comes into a turn-off state and the current flows little or nothing because of the depletion layer. Thus, a switching operation of the current can be performed by repeating the turn-on and turn-off states.

In the present embodiment, the P-type second diffusion layer 12 is formed for an emitter layer of the thyristor.

The second diffusion layer 12 is an active region which affects the reverse recovery characteristics and since the residual carriers are immediately moved at the time of the turn-off state by forming a depth D2 of the second diffusion layer 12 to be comparatively small, the reverse recovery characteristic can be improved. In addition, as the depth D2 of the second diffusion layer 12 is made small, the thickness of the $N^{-}$-type layer is increased as compared with the conventional one, whereby a reverse-blocking withstand voltage characteristic can be improved.

Especially, the depth D2 of the second diffusion layer 12 from the second side of the semiconductor substrate is preferably smaller than a depth D1 of the first diffusion layer 11 from the first side of the semiconductor substrate, whereby the reverse recovery characteristics and the reverse-blocking withstand voltage characteristic can be more improved. The depth D1 of the first diffusion layer 11 and the depth D2 of the second diffusion layer 12, are respectively selected, for example, within a range of 50 to 100 μm and in a relation of D1>D2.

In addition, the exposed portion of the second diffusion layer 12 on the lateral side of the substrate affects the withstand voltage characteristic and the depth and the carrier concentration of the exposed portion are set about the same degree as those of the conventional emitter layer. Thus, the same degree of the withstand voltage characteristic as that of the conventional one can be acquired.

Embodiment 2

Figure 2A:
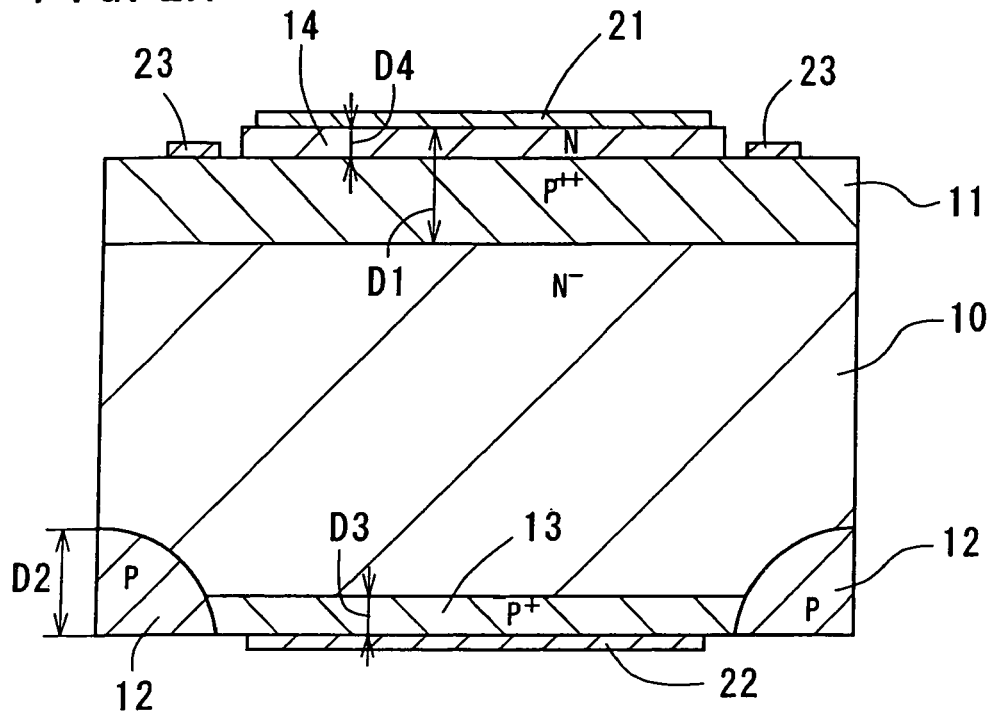
Figure 2B:
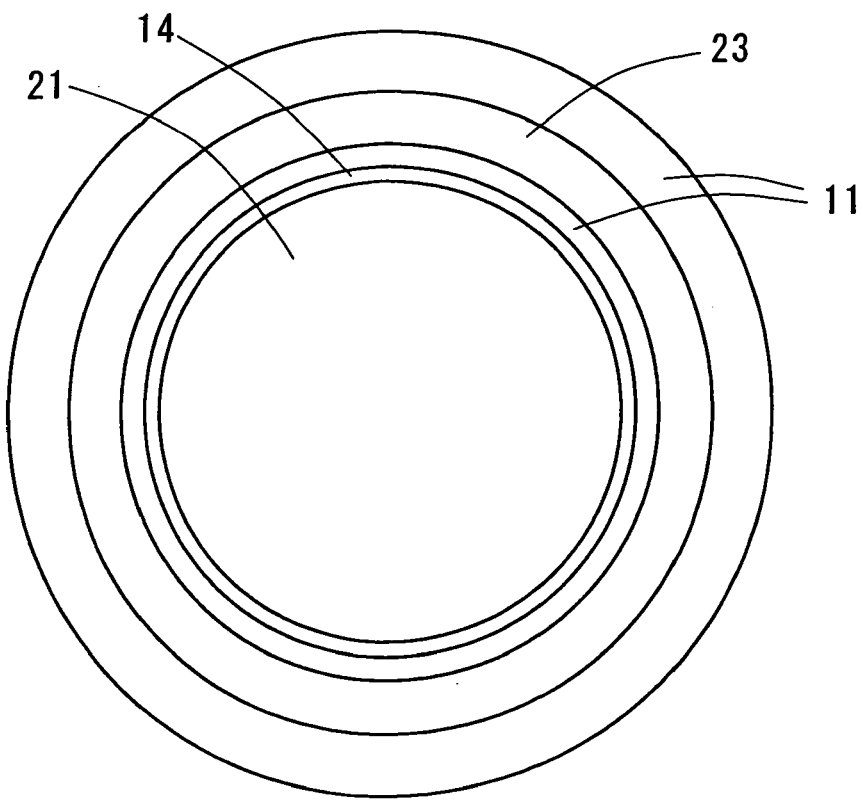

FIGS. 2A and 2B illustrate a second embodiment of the present invention, in which FIG. 2A is a vertical sectional view and FIG. 2B is a plan view. A $P^{++}$-type first diffusion layer 11 is formed by diffusing P-type impurities (for example, B, Al or the like) on a front side of an $N^{-}$-type semiconductor substrate 10 (for example, Si or the like). Then, an N-type fourth diffusion layer 14 which is shallower than the first diffusion layer 11 is formed by diffusing N-type impurities (for example, P, As or the like) on the front side of the substrate 10. The fourth diffusion layer 14 is partially removed by etching or the like and the first diffusion layer 11 is partially exposed on the front surface of the substrate.

Meanwhile, a P-type second diffusion layer 12 is locally formed in a ring-shape so as to be exposed on the lateral side of the substrate by diffusing P-type impurities on the back side of the substrate 10. In addition, P-type impurities are diffused on the back side of the substrate 10 and a $P^{+}$-type third diffusion layer 13 is locally formed so as to be distributed inward from the second diffusion layer 12 and so as not to be exposed to the lateral side of the substrate.

Thus, there is provided a PNPN-junction structure which is capable of a thyristor operation.

As shown in FIG. 2B, a circular cathode electrode 21 is provided on the front side of the substrate 10 so as to be in contact with the N-type fourth diffusion layer 14 and a ring-shaped gate electrode 23 is provided so as to be in contact with the P$^{++}$-type first diffusion layer 11.

A circular anode electrode 22 is formed on the back side of the substrate 10 so as to be in contact with the P$^{+}$-type third diffusion layer 13 but in no contact with the P-type diffusion layer 12.

Then, the operation will be described. As the cathode electrode 21 is connected to a ground line and a positive voltage is applied to the anode electrode 22, the P$^{+}$-type third diffusion layer 13 and the N$^{-}$-type substrate 10 are in a forward bias state, the P$^{++}$-type first diffusion layer 11 and the N-type fourth diffusion layer 14 are in a forward bias state and the N$^{-}$-type substrate 10 and the P$^{++}$-type first diffusion layer 11 are in a reverse bias state, whereby a depletion layer is formed. At this time, a current flows little or nothing because of the depletion layer.

When an anode voltage is further increased and exceeds the breakdown voltage, the current is rapidly increased and a semiconductor device comes into a turn-on state. At this time, the breakdown voltage can be controlled by controlling an amount of the current (carriers) injected from the gate electrode 23.

Then, when a reverse voltage is applied to the anode electrode 22 in the turn-on state, the P$^{+}$-type third diffusion layer 13 and the N$^{-}$-type substrate 10 come into a reverse bias state, the P$^{++}$-type first diffusion layer 11 and N-type fourth diffusion layer 14 come into a reverse bias state, and the N$^{-}$-type substrate 10 and the P$^{++}$-type first diffusion layer 11 come into a forward bias state. At this time, since it takes time for the carriers stored inside to move, a reverse current flows for a certain period of time.

Then, reverse recovery characteristics can be improved by applying a current to the gate electrode 23 in a direction reverse to that in the on-state in order to actively extract residual carriers. If the residual carrier no longer exists, it comes into a turn-off state and the current flows little or nothing because of the depletion layer. Thus, a switching operation of the current can be performed by repeating the turn-on and turn-off states.

In the present embodiment, the P-type second diffusion layer 12 and the P$^{+}$-type third diffusion layer 13 are formed in the two-stage structure for an emitter layer of the thyristor. That is, the third diffusion layer 13 having a high carrier concentration is provided at a center of the emitter layer and the second diffusion layer 12 having a low carrier concentration is provided so as to surround the third diffusion layer 13 on the back side of the substrate.

The third diffusion layer 13 is an active region which affects the reverse recovery characteristics and since the residual carriers are immediately moved at the time of the turn-off state by forming a depth D3 of the third diffusion layer 13 to be comparatively small, the reverse recovery characteristics can be improved. In addition, as the depth D3 of the third diffusion layer 13 is made small, the thickness of the N$^{-}$-type layer is increased as compared with the conventional one, whereby a reverse-blocking withstand voltage characteristic can be improved.

Especially, the depth D3 of the third diffusion layer 13 from the second side of the semiconductor substrate is preferably smaller than a depth D1 of the first diffusion layer 11 from the first side of the semiconductor substrate and the depth D2 of the second diffusion layer 12 from the second side of the semiconductor substrate, whereby the reverse recovery characteristics and the reverse-blocking withstand voltage characteristic can be more improved. The depth D1 of the first diffusion layer 11, the depth D2 of the second diffusion layer 12 and the depth D3 of the third diffusion layer 13 are respectively selected, for example, within a range of 50 to 100 μm, and in a relation of D1>D2>D3.

In addition, the second diffusion layer 12 is a portion which affects the withstand voltage characteristic. The depth D2 and the carrier concentration of the second diffusion layer 12 are set about the same degree as those of the conventional emitter layer and formed so as to be lower than the carrier concentration of the third diffusion layer 13, whereby the same degree of the withstand voltage characteristic as the conventional one can be acquired.

Embodiment 3

Figure 3:
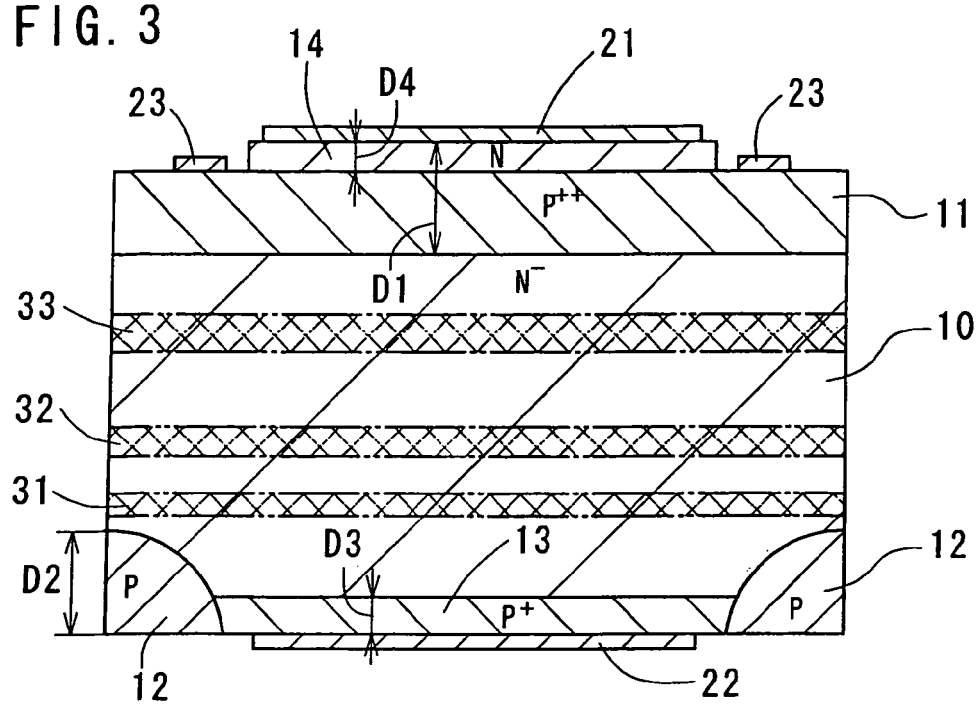
FIG. 3 is a vertical sectional view showing a third embodiment of the present invention.

FIG. 3 is a vertical sectional view showing a third embodiment of the present invention. A P$^{++}$-type first diffusion layer 11 is formed by diffusing P-type impurities (for example, B, Al or the like) on a front side of an N$^{-}$-type semiconductor substrate 10 (for example, Si or the like). Then, an N-type fourth diffusion layer 14 which is shallower than the first diffusion layer 11 is formed by diffusing N-type impurities (for example, P, As or the like) on the front side of the substrate 10. The fourth diffusion layer 14 is partially removed by etching or the like and the first diffusion layer 11 is partially exposed on the front surface of the substrate.

Meanwhile, a P-type second diffusion layer 12 is locally formed in a ring-shape so as to be exposed on the lateral side of the substrate by diffusing P-type impurities on the back side of the substrate 10. In addition, P-type impurities are diffused on the back side of the substrate 10 and a P$^{+}$-type third diffusion layer 13 is locally formed so as to be distributed inward from the second diffusion layer 12 and so as not to be exposed to the lateral side of the substrate.

Thus, there is provided a PNPN-junction structure which is capable of a thyristor operation.

A shape and a configuration of each electrode is the same as shown in FIG. 1B. More specifically, a circular cathode electrode 21 is provided so as to be in contact with the N-type fourth diffusion layer 14 and a ring-shaped gate electrode 23 is provided so as to be in contact with the P$^{++}$-type first diffusion layer 11, respectively, on the front side of the substrate 10.

A circular anode electrode 22 is formed on the back side of the substrate 10 so as to be in contact with the P$^{+}$-type third diffusion layer 13 but in no contact with the P-type second diffusion layer 12.

As for the emitter layer of the thyristor, like in FIG. 1, the P-type second diffusion layer 12 and the P$^{+}$-type third diffusion layer 13 are formed in the two-stage structure. More specifically, in the view from the backside of the substrate, the third diffusion layer 13 having a high carrier concentration is provided at a center of the emitter layer and the second diffusion layer 12 having a low carrier concentration is provided so as to surround the third diffusion layer 13.

The third diffusion layer 13 is an active region which affects the reverse recovery characteristics and since the residual carriers are immediately moved at the time of the turn-off state by forming a depth D3 of the third diffusion layer 13 to be comparatively small, the reverse recovery characteristics can be improved. In addition, as the depth D3 of the third diffusion layer 13 is made small, the thickness of the N$^{-}$-type layer is increased as compared with that of the conventional one, whereby a reverse-blocking withstand voltage characteristic can be improved.

Especially, the depth D3 of the third diffusion layer 13 from the second side of the semiconductor substrate is preferably smaller than a depth D1 of the first diffusion layer 11 from the first side of the semiconductor substrate and the depth D2 of the second diffusion layer 12 from the second side of the semiconductor substrate, whereby the reverse recovery characteristics and the reverse-blocking withstand voltage characteristic can be more improved. The depth D1 of the first diffusion layer 11, the depth D2 of the second diffusion layer 12 and the depth D3 of the third diffusion layer 13 are respectively selected, for example, within a range of 50 to 100 μm, and in a relation of D1>D2>D3.

Meanwhile, the second diffusion layer 12 is a portion which affects the withstand voltage characteristic. The depth D2 and the carrier concentration of the second diffusion layer 12 are set about the same degree as those of the conventional emitter layer and formed so as to be lower than the carrier concentration of the third diffusion layer 13. Thus, the same degree of the withstand voltage characteristic as the conventional one can be acquired.

In the present embodiment, a plurality (three in FIG. 3) of lifetime control regions are formed inside the N$^-$-type layer of the semiconductor substrate 10 so as to be substantially parallel to the substrate surface. Within the lifetime control regions, a crystal defect is introduced intentionally by irradiating proton and the like and a deep level is generated in a semiconductor forbidden band, whereby the residual carriers can be immediately vanished at the time of turn-off state and the reverse recovery characteristics can be improved.

In addition, the length of the lifetime of the residual carriers in the lifetime control region can be controlled by an amount of radiation of proton and the depth of the lifetime control region can be controlled by a radiation energy of proton.

Here, as shown in FIG. 3, there are three lifetime control regions. The first lifetime control region 31 which is most close to the second diffusion layer 12 and the third diffusion 13 preferably has a lifetime shorter than the second lifetime control region 32 which is secondly close to the second and third diffusion layers 12 and 13. In addition, the first lifetime control region 31 preferably has the shortest lifetime among the lifetime control regions.

Especially, a lifetime τ1 of the first control region 31 which is most close to the second diffusion layer 12 and the third diffusion layer 13, a lifetime τ2 of the second control region 32 which is secondly close to those layers and a lifetime τ3 of the third control region 33 which is thirdly close to those layers are preferably has a relation of τ1<τ2<τ3.

Figure 7A:
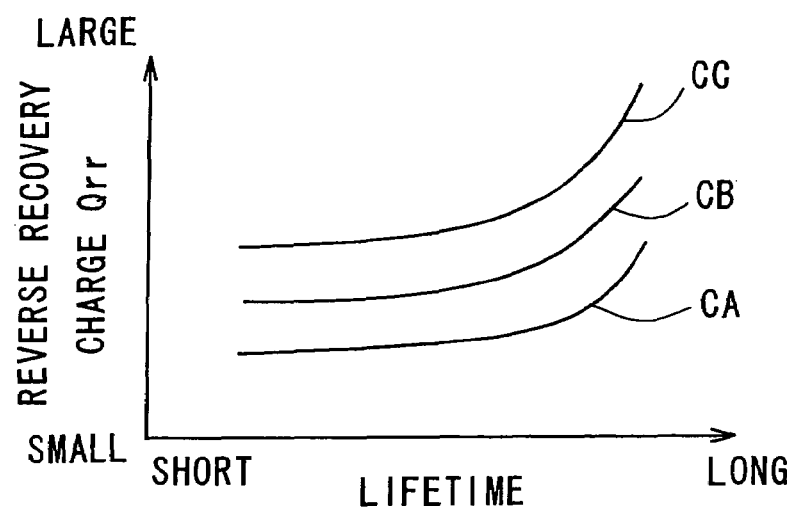
FIG. 7A is a graph showing a relation between a reverse recovery charges Qrr and a lifetime of residual carriers at the time of a turn-off state and FIG. 7B is a graph showing a reverse recovery current waveform at the time of the turn-off state.
Figure 7B:
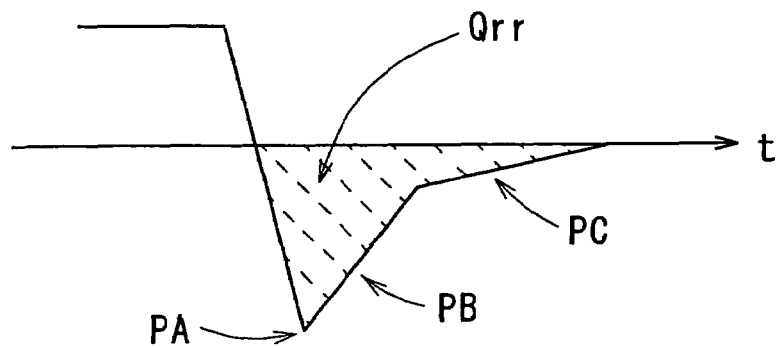

FIG. 7A illustrates a graph showing a relation between a reverse recovery charge Qrr and the lifetime of residual carriers at the time of the turn-off state. FIG. 7B illustrates a graph showing a reverse recovery current waveform at the time of the turn-off state. Referring to FIG. 7A, a curve CA shows a case where the lifetime τ1 of the first lifetime control region 31 is shortest among the three lifetime control regions. A curve CB shows a case where the lifetime τ2 of the second lifetime control region 32 is shortest. A curve CC shows a case where the lifetime τ3 of the third lifetime control region 33 is shortest.

Referring to the curves CA to CC, as the lifetime of the residual carriers is increased, the reverse recovery charge Qrr tends to be gradually increased at the time of the turn-off state.

As shown in FIG. 7B, the reverse recovery charge Qrr corresponds to a time integration value of the reverse recovery current. Thus, as the reverse recovery charge Qrr is decreased, the reverse recovery characteristics become better. Especially, it is largely influenced by the lifetime τ1 of the first lifetime control region 31 during a period PA from a zero crossing point till the first peak point in the reverse recovery current waveform, it is largely influenced by the lifetime τ2 of the second lifetime control region 32 during a period PB from the first peak point till a next curvature point, and it is largely influenced by the lifetime τ3 of the third lifetime control region 33 during a period PC from the end point of the period PB till a converging point to a current zero.

Therefore, referring to the lifetimes τ1 to τ3 of the lifetime control regions, when a relation of τ1<τ2<τ3 is satisfied, reverse recovery loss and turn-off loss can be improved.

Embodiment 4

Figure 4:
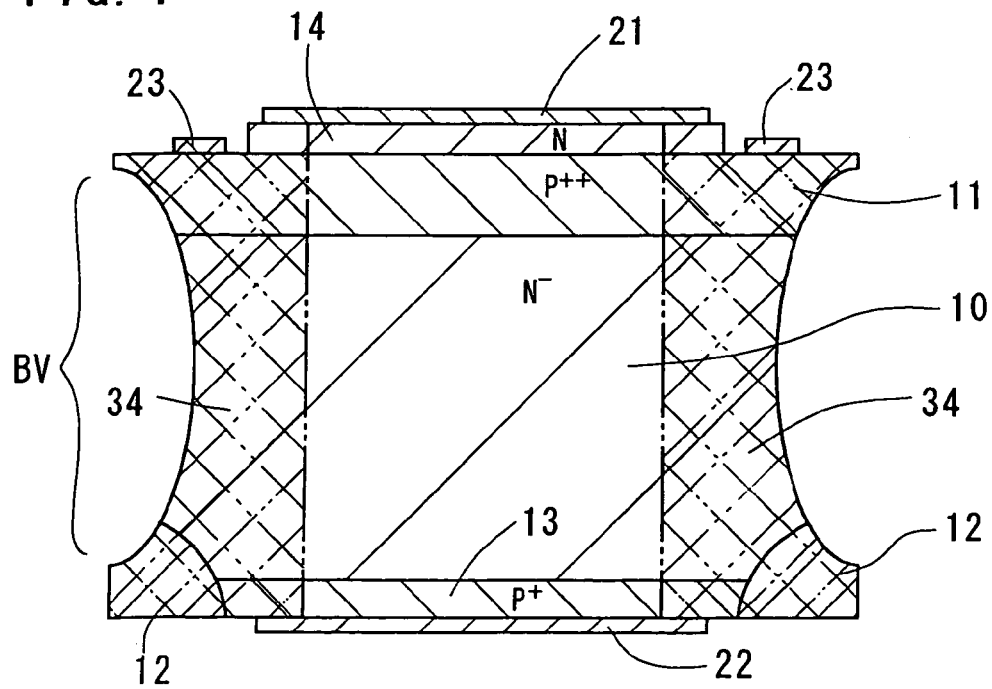
FIG. 4 is a vertical sectional view showing a fourth embodiment of the present invention.

FIG. 4 illustrates a vertical sectional view showing a fourth embodiment of the present invention. P$^{++}$-type first diffusion layer 11 is formed by diffusing P-type impurities (for example, B, Al or the like) on a front side of an N$^-$-type semiconductor substrate 10 (for example, Si or the like). Then, an N-type fourth diffusion layer 14 which is shallower than the first diffusion layer 11 is formed by diffusing N-type impurities (for example, P, As or the like) on the front side of the substrate 10. The fourth diffusion layer 14 is partially removed by etching or the like and the first diffusion layer 11 is partially exposed on the front surface of the substrate.

Meanwhile, a P-type second diffusion layer 12 is locally formed in a ring-shape so as to be exposed on the lateral side of the substrate by diffusing P-type impurities on the back side of the substrate 10. In addition, P-type impurities are diffused on the back side of the substrate 10 and a P$^+$-type third diffusion layer 13 is locally formed so as to be distributed inward from the second diffusion layer 12 and so as not to be exposed to the lateral side of the substrate.

Thus, there is provided a PNPN-junction structure which is capable of a thyristor operation.

A shape and a configuration of each electrode is the same as shown in FIG. 1B. More specifically, a circular cathode electrode 21 is provided so as to be in contact with the N-type fourth diffusion layer 14 and a ring-shaped gate electrode 23 is provided so as to be in contact with the P$^{++}$-type first diffusion layer 11 on the front side of the substrate 10.

A circular anode electrode 22 is formed so as to be in contact with the P$^+$-type third diffusion layer 13 but in no contact with the P-type second diffusion layer 12 on the back side of the substrate 10.

As for the emitter layer of the thyristor, like in FIG. 1, the P-type second diffusion layer 12 and the P$^+$-type third diffusion layer 13 are formed in the two-stage structure. More specifically, in the view from the backside of the substrate, the third diffusion layer 13 having a high carrier concentration is provided at a center of the emitter layer and the second diffusion layer 12 having a low carrier concentration is provided so as to surround the third diffusion layer 13.

The third diffusion layer 13 is an active region which affects the reverse recovery characteristics and since the residual carriers are immediately moved at the time of the turn-off state by forming a depth D3 of the third diffusion layer 13 to be comparatively small, the reverse recovery characteristics can be improved. In addition, as the depth D3 of the third diffusion layer 13 is made small, the thickness of the N⁻-type layer is increased as compared with the conventional one, whereby a reverse-blocking withstand voltage characteristic can be improved.

Especially, the depth D3 of the third diffusion layer 13 from the second side of the semiconductor substrate is preferably smaller than a depth D1 of the first diffusion layer 11 from the first side of the semiconductor substrate and the depth D2 of the second diffusion layer 12 from the second side of the semiconductor substrate, whereby the reverse recovery characteristics and the reverse-blocking withstand voltage characteristic can be more improved. The depth D1 of the first diffusion layer 11, the depth D2 of the second diffusion layer 12 and the depth D3 of the third diffusion layer 13 are respectively selected, for example, within a range of 50 to 100 μm, and in a relation of D1>D2>D3.

In addition, the second diffusion layer 12 is a portion which affects the withstand voltage characteristic. As the depth D2 and the carrier concentration of the second diffusion layer 12 are set so as to be about the same degree as those of the conventional emitter layer and formed so as to be lower than the carrier concentration of the third diffusion layer 13, the same degree of the withstand voltage characteristic as that of the conventional one can be acquired.

In the present embodiment, a bevel surface BV having a concave cross-section is formed along the lateral side of the semiconductor substrate 10 and a fourth lifetime control region 34 is cylindrically formed along the periphery of the bevel surface BV. In the fourth lifetime control region 34, a crystal defect is introduced intentionally by radiating proton and a deep level is generated in a semiconductor forbidden band. Thus, the current (carriers) is concentrated to the center of the active region and the current is not likely to flow in the periphery portion of the lateral side of the substrate. Thus, the heat generated by current loss is likely to be transmitted to the cathode electrode 21 and the anode electrode 22 each having a high heat dissipation effect because of pressed-contact with an outer electrode (not shown) and not likely to be transmitted to the lateral side of the substrate having a low heat dissipation effect. As a result, an operation temperature can be improved.

Especially, an internal interface of the fourth lifetime control region 34 is preferably disposed inward from a portion where an internal interface of the second diffusion layer 12 and an internal interface of the third diffusion layer 13 are intersecting with each other. Thus, a current density and a temperature rise can be suppressed in the vicinity of the lateral side of the substrate. As a result, the operation temperature can be improved.

Embodiment 5

Figure 5A:
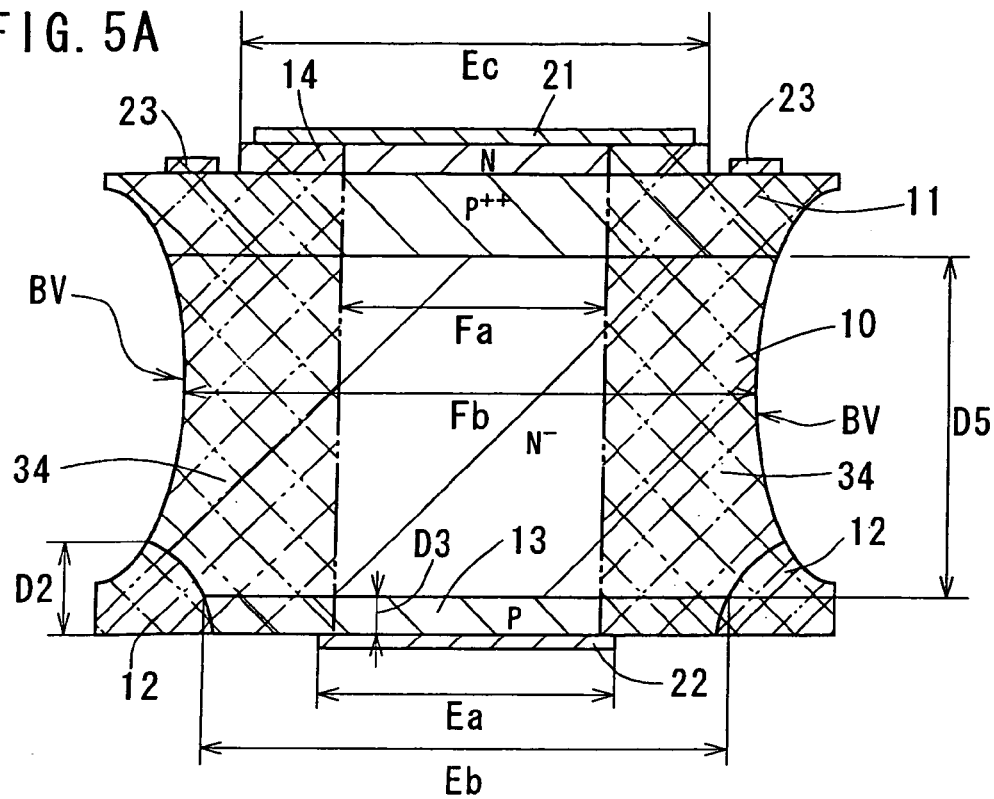
Figure 5B:
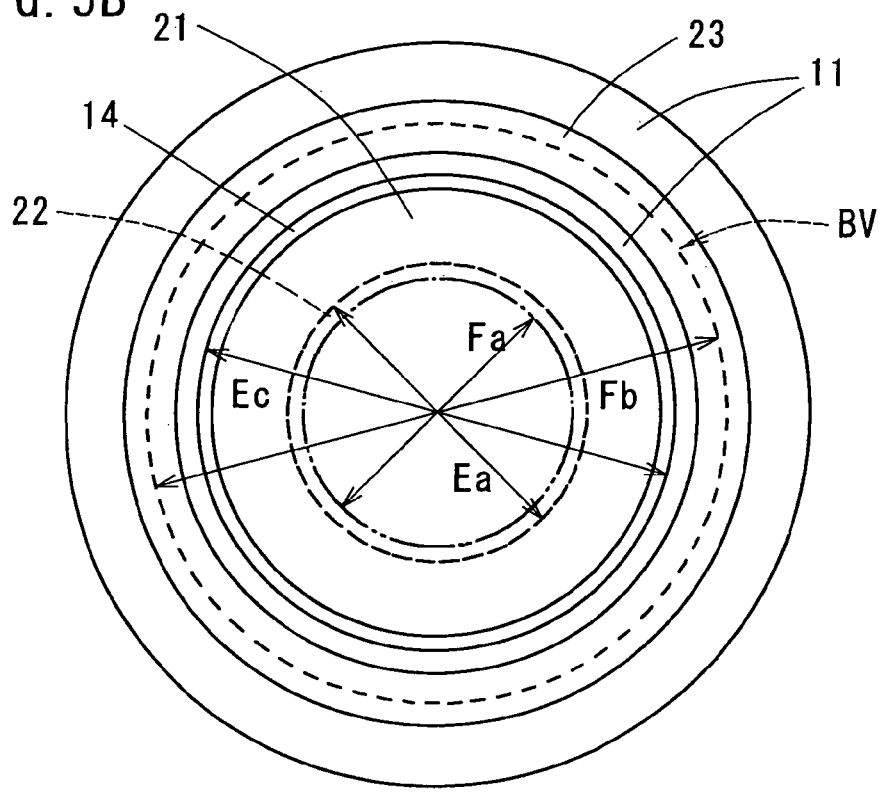

FIGS. 5A and 5S illustrate a fifth embodiment of the present invention, in which FIG. 5A is a vertical sectional view and FIG. 5B is a plan view. A P⁺⁺-type first diffusion layer 11 is formed by diffusing P-type impurities (for example, B, Al or the like) on a front side of an N⁻-type semiconductor substrate 10 (for example, Si or the like). Then, an N-type fourth diffusion layer 14 which is shallower than the first diffusion layer 11 is formed by diffusing N-type impurities (for example, P, As or the like) on the front side of the substrate 10. The fourth diffusion layer 14 is partially removed by etching or the like and the first diffusion layer 11 is partially exposed on the front surface of the substrate.

Meanwhile, a P-type second diffusion layer 12 is locally formed in a ring-shape so as to be exposed on the lateral side of the substrate by diffusing P-type impurities on the back side of the substrate 10. In addition, P-type impurities are diffused on the back side of the substrate 10 and a P⁺-type third diffusion layer 13 is locally formed so as to be distributed inward from the second diffusion layer 12 and so as not to be exposed to the lateral side of the substrate.

Thus, there is provided a PNPN-junction structure which is capable of a thyristor operation.

A shape and a configuration of each electrode is the same as shown in FIG. 1B. More specifically, a circular cathode electrode 21 is provided so as to be in contact with the N-type fourth diffusion layer 14 and a ring-shaped gate electrode 23 is provided so as to be in contact with the P⁺⁺-type first diffusion layer 11 on the front side of the substrate 10.

A circular anode electrode 22 is formed so as to be in contact with the P⁺-type third diffusion layer 13 but in no contact with the P-type second diffusion layer 12 on the back side of the substrate 10.

As for the emitter layer of the thyristor, like in FIG. 1, the P-type second diffusion layer 12 and the P⁺-type third diffusion layer 13 are formed in the two-stage structure. More specifically, in the view from the backsides of the substrate, the third diffusion layer 13 having a high carrier concentration is provided at a center of the emitter layer and the second diffusion layer 12 having a low carrier concentration is provided so as to surround the third diffusion layer 13.

The third diffusion layer 13 is an active region which affects the reverse recovery characteristics and since the residual carriers are immediately moved at the time of the turn-off state by forming a depth D3 of the third diffusion layer 13 to be comparatively small, the reverse recovery characteristics can be improved. In addition, as the depth D3 of the third diffusion layer 13 is made small, the thickness of the N⁻-type layer is increased as compared with the conventional one, whereby a reverse-blocking withstand voltage characteristic can be improved.

Especially, the depth D3 of the third diffusion layer 13 from the second side of the semiconductor substrate is preferably smaller than a depth D1 of the first diffusion layer 11 from the first side of the semiconductor substrate and the depth D2 of the second diffusion layer 12 from the second side of the semiconductor substrate, whereby the reverse recovery characteristics and the reverse-blocking withstand voltage characteristic can be more improved. The depth D1 of the first diffusion layer 11, the depth D2 of the second diffusion layer 12 and the depth D3 of the third diffusion layer 13 are respectively selected, for example, within a range of 50 to 100 μm, and in a relation of D1>D2>D3.

In addition, the second diffusion layer 12 is a portion which affects the withstand voltage characteristic. The depth D2 and the carrier concentration of the second diffusion layer 12 are set so as to be about the same degree as those of the conventional emitter layer and formed so as to be lower than the carrier concentration of the third diffusion layer 13. Thus, the same degree of the withstand voltage characteristic as the conventional one can be acquired.

In the present embodiment, a bevel surface BV having a concave cross-section is formed along the lateral side of the semiconductor substrate 10 and a fourth lifetime control region 34 is cylindrically formed along the periphery of the bevel surface BV. In the fourth lifetime control region 34, a crystal defect is introduced intentionally by radiating proton or the like and a deep level is generated in a semiconductor forbidden band. Thus, the current (carriers) is concentrated to the center of the active region and the current is not likely to flow in the periphery portion of the lateral side of the substrate. Thus, the heat generated by current loss is likely to be transmitted to the cathode electrode 21 and the anode electrode 22 each having a high heat dissipation effect because of pressed-contact with an outer electrode (not shown) and not likely to be transmitted to the lateral side of the substrate having a low heat dissipation effect. As a result, an operation temperature can be improved.

Especially, a portion (diameter Eb) where an internal interface of the second diffusing layer 12 and an internal interface of the third diffusion layer 13 intersect with each other is preferably disposed inward from the most inner diameter Fb of the bevel surface BV. Thus, a current density and a temperature rise can be suppressed in the vicinity of the lateral side of the substrate. As a result, the operation temperature can be improved.

In addition, the portion (diameter Eb) where the internal interface of the second diffusion layer 12 and the internal interface of the third diffusion layer 13 intersect with each other is preferably disposed outward from the most outer diameter Ea of the anode electrode 22. Thus, the current density and the temperature rise can be suppressed in the vicinity of the lateral side of the substrate. As a result, the operation temperature can be improved.

In addition, the most inner diameter Fb of the bevel surface, the diameter Eb of the portion where the internal interface of the second diffusion layer 12 and the internal interface of the third diffusion layer 13 intersect with each other, the most outer diameter Ea of the anode electrode 22 and a most inner diameter Fa of an internal interface of the fourth lifetime control region 34 preferably have a relation of Fb>Eb>Ea>Fa. Thus, the current density and the temperature rise can be suppressed in the vicinity of the lateral side of the substrate. As a result, the operation temperature can be improved.

Furthermore, the diameter Eb of the portion where the internal interface of the second diffusion layer 12 and the internal interface of the third diffusion layer 13 intersect with each other, the most outer diameter Ea of the anode electrode 22 and the depth D2 of the second diffusion layer 12 preferably have a relation of Eb−Ea>2×D2. Thus, since a projection interval between an edge of the anode electrode and the portion where the second diffusion layer 12 and the third diffusion layer 13 intersect with each other is larger than the depth D2 of the second diffusion layer 12, current is not likely to flow into the second diffusion layer 12. Thus, the current density and the temperature rise can be suppressed in the vicinity of the lateral side of the substrate. As a result, the operation temperature can be improved. Incidentally, in a case the bevel surface BV is formed on the lateral side of the substrate, the depth D2 of the second diffusion layer 12 is defined as a distance between the portion where the internal interface of the second diffusion layer 12 and the bevel surface BV intersect with each other and the back side of the substrate.

Furthermore, the diameter Eb of the portion where the internal interface of the second diffusion layer 12 and the internal interface of the third diffusion layer 13 intersect with each other, a most outer diameter Ec of the fourth diffusion layer 14 and a distance D5 between the internal interface of the first diffusion layer 11 and the internal interface of the third diffusion layer 13 preferably have a relation of Ec<Eb−D5. Thus, the current density and the temperature rise can be suppressed in the vicinity of the lateral side of the substrate. As a result, the operation temperature can be improved. Incidentally, in the sectional view of FIG. 5, the scale in the height direction is enlarged for easy understanding.

Figure 6:
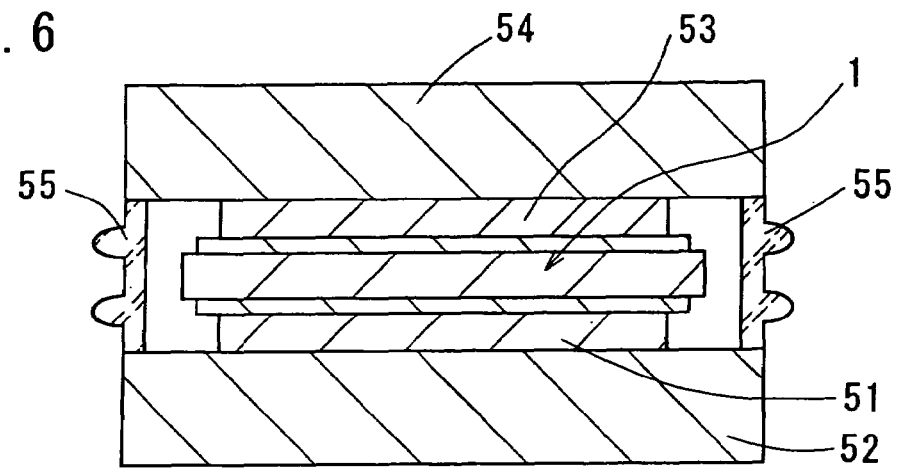
FIG. 6 is a sectional view showing an example of mounting a pressed-contact type semiconductor device according to the present invention.

FIG. 6 is a sectional view showing an example of mounting a pressed-contact type semiconductor device according to the present invention. A pressed-contact type semiconductor device 1 having the above structure is sandwiched and pressed between an electrode plate 51 and an outer anode electrode 52 arranged on the anode side, and a electrode plate 53 and an outer cathode electrode 54 arranged on the cathode side. The outer anode electrode 52 and the outer cathode electrode 54 are attached to a casing 55 formed of an electrically insulating material. This kind of pressed-contact type mounting structure is suitable for controlling a power of high voltage and large current, since the electrodes 52 and 54 function as a heat sink of the semiconductor device 1.

FIG. 8 is a graph showing an example of a simulation result of the reverse recovery characteristics. The horizontal axis represents time, the left vertical axis represents current and voltage, and the right vertical axis represents power loss. The solid line represents the present invention (FIG. 2) and the broken line represents a conventional structure in the graph.

At the time of 15 μm, in a turn-on state, the anode current is about 800 A, the anode voltage is about 0 V and the power loss represents about 0 MVA.

At the time of 18 μm, a reverse voltage is applied to the anode electrode and the current is decreased. At the time of 20 μm, the reverse recovery current reaches the peak. At this time, although the peak value of the broken line is about −1,000 A, the solid line is suppressed at about −800 A.

At the time of 21 μm, the power loss reaches the peak. At this time, although the peak value of the broken line is about 3.1 MVA, the solid line is suppressed at about 2.5 MVA.

In the vicinity of the time of 22 μm, a maximum reverse voltage VRM reaches the peak. At this time, although the peak value of the broken line is about −5,500 V, the solid line is suppressed at about −5,500 V.

Thus, it indicates that the reverse recovery characteristics can be improved by employing the two-stage structure of the P-type second diffusion layer 12 and the P$^+$-type third diffusion layer 13 for the emitter layer of the thyristor.

FIG. 9 is a graph showing an example of a simulation result of the reverse-blocking voltage characteristics. The horizontal axis represents a reverse-blocking voltage and the vertical axis represents a leakage current. The solid line represent the present invention (FIG. 2) and the broken line represents a conventional structure in the graph.

When the reverse-blocking voltage is 7,500 V, although the value of the broken line is about 0.2 μA, the solid line is suppressed at about 0.1 μA. When the reverse-blocking voltage is 8000 V, although the value of the broken line is about 0.8 μA, the solid line is suppressed at about 0.15 μA.

In addition, the maximum reverse-blocking voltage is about 8,050 V according to the broken line but it is improved to be about 8,300 V according to the solid line in the graph.

Thus, it indicates that the reverse-blocking voltage characteristics can be improved by forming the P$^+$-type third diffusion layer 13 having a depth smaller than that of the P-type second diffusion layer 12.

Although it is illustrated that the first conductivity type is N-type, the second conductivity type is P-type, the first electrode is the cathode electrode and the second electrode is anode electrode in the above description, the present invention is applicable even when the polarities are reversed.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A pressed-contact type semiconductor device comprising:
   a first conductivity type of semiconductor substrate;
   a first diffusion layer formed by diffusing a second conductivity type of impurities on a first side of the semiconductor substrate;
   a fourth diffusion layer formed by diffusing a first conductivity type of impurities on the first side of the semiconductor substrate so as to be shallower than the first diffusion layer;
   a gate electrode provided on the first side of the semiconductor substrate so as to be in contact with the first diffusion layer;
   a first electrode provided on the first side of the semiconductor substrate so as to be in contact with the fourth diffusion layer;
   a second diffusion layer locally formed by diffusing the second conductivity type of impurities on a second side of the semiconductor substrate so as to be exposed on a lateral side of the substrate;
   a third diffusion layer locally formed by diffusing the second conductivity type of impurities on the second side of the semiconductor substrate so as not to be exposed on the lateral side of the substrate; and
   a second electrode provided on the second side of the semiconductor substrate so as to be in contact with the third diffusion layer;
   wherein a plurality of lifetime control regions each having a lifetime shorter than that of the semiconductor substrate are formed inside the semiconductor substrate so as to be substantially parallel to the substrate surface, and a first lifetime control region which is closest to the second and third diffusion layers has a lifetime shorter than that of a second lifetime control region which is second closest to the second and third diffusion layers, and
   wherein a depth $D1$ of the first diffusion layer from the first side of the semiconductor substrate, a depth $D2$ of the second diffusion layer from the second side of the semiconductor substrate and a depth $D3$ of the third diffusion layer from the second side of the semiconductor substrate have a relation of $D1>D2>D3$.

* * * * *